(12) United States Patent
Ishikawa et al.

(10) Patent No.: US 6,482,701 B1
(45) Date of Patent: Nov. 19, 2002

(54) INTEGRATED GATE BIPOLAR TRANSISTOR AND METHOD OF MANUFACTURING THE SAME

(75) Inventors: Eiji Ishikawa, Okazaki (JP); Kenji Kondo, Hoi-gun (JP); Hajime Soga, Toyota (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/630,786

(22) Filed: Aug. 2, 2000

(30) Foreign Application Priority Data

Aug. 4, 1999 (JP) .......................................... 11-221242

(51) Int. Cl.[7] .......................................... H01L 21/336
(52) U.S. Cl. ...................................... 438/270; 438/700
(58) Field of Search .............................. 438/197, 204, 438/236, 206, 259, 266, 270, 273, 514, 524, 589, 700, 706, 712, 733

(56) References Cited

U.S. PATENT DOCUMENTS

| | | | | |
|---|---|---|---|---|
| 4,693,781 A | * | 9/1987 | Leung et al. ............... | 156/643 |
| 4,839,306 A | | 6/1989 | Wakamatsu ................ | 438/444 |
| 5,072,266 A | * | 12/1991 | Bulucea et al. ............ | 357/23.4 |
| 5,236,861 A | | 8/1993 | Otsu ........................... | 438/444 |
| 5,242,845 A | * | 9/1993 | Baba et al. ................. | 438/270 |
| 5,387,528 A | * | 2/1995 | Hutchings et al. .......... | 438/589 |
| 5,891,807 A | | 4/1999 | Muller et al. ............... | 438/713 |

FOREIGN PATENT DOCUMENTS

| | | |
|---|---|---|
| JP | A-60-68650 | 4/1985 |
| JP | A-60-158642 | 8/1985 |
| JP | A-6-219759 | 11/1985 |
| JP | A-61-119056 | 6/1986 |
| JP | A-62-136065 | 6/1987 |
| JP | A-62-160731 | 7/1987 |
| JP | A-62-185353 | 8/1987 |
| JP | A-62-293661 | 12/1987 |
| JP | A-63-2371 | 1/1988 |
| JP | A-63-115358 | 5/1988 |
| JP | A-63-166230 | 7/1988 |
| JP | A-63-229845 | 9/1988 |
| JP | A-63-278338 | 11/1988 |
| JP | 64-57623 | 3/1989 |
| JP | A-1-196134 | 8/1989 |
| JP | A-1-216538 | 8/1989 |
| JP | A-2-3956 | 1/1990 |
| JP | 2-260424 | 10/1990 |

(List continued on next page.)

OTHER PUBLICATIONS

U.S. patent application Ser. No. 09/758,377, Aoki et al., filed Jan. 12, 2001.
S. J. Fonash, "Damage effects in Dry Etching", Solid State Technology, Apr. 1985, pp. 201–205.

(List continued on next page.)

Primary Examiner—David Nelms
Assistant Examiner—David Nhu
(74) Attorney, Agent, or Firm—Law Offices of David G. Posz

(57) ABSTRACT

A method of manufacturing a trench gate type IGBT element, which can sufficiently round off a corner at a bottom of a trench with restricting silicon from being excessively etched. A trench is formed at a surface of a P[+]-type monocrystalline silicon substrate by conducting an anisotropic etching (STEP 1). A corner portion at a bottom of the trench is formed to a concave shape surface by conducting a concave etching (STEP 2). The concave etching etches the silicon substrate so that a diameter of the trench is gradually reduced as the etching advances. After that, the corner portion at a bottom of the trench is rounded off by conducting an isotropic etching (STEP 3). Since the corner portion is chamfered, a radius of curvature of the corner portion of the bottom of the trench can be increased even if an amount of the etching using the isotropic etching in the STEP 3 is small.

12 Claims, 4 Drawing Sheets

FOREIGN PATENT DOCUMENTS

| | | |
|---|---|---|
| JP | A-2-260660 | 10/1990 |
| JP | A-2-271618 | 11/1990 |
| JP | A-2-271619 | 11/1990 |
| JP | A-2-271620 | 11/1990 |
| JP | A-3-147327 | 6/1991 |
| JP | A-3-252131 | 11/1991 |
| JP | A-4-37152 | 2/1992 |
| JP | 5-102297 | 4/1993 |
| JP | A-5-226298 | 9/1993 |
| JP | B2-5-75184 | 10/1993 |
| JP | B2-6-18248 | 3/1994 |
| JP | B2-6-24228 | 3/1994 |
| JP | B2-7-48547 | 5/1995 |
| JP | B2-2519474 | 5/1996 |
| JP | 8-203863 | 8/1996 |
| JP | B2-2552152 | 8/1996 |
| JP | B2-2589209 | 12/1996 |
| JP | B2-2602808 | 1/1997 |
| JP | B2-2635607 | 4/1997 |
| JP | A-9-162168 | 6/1997 |
| JP | B2-2667552 | 6/1997 |
| JP | B2-2671312 | 7/1997 |
| JP | A-9-283535 | 10/1997 |
| JP | A-9-307101 | 11/1997 |
| JP | 9-330928 | 12/1997 |
| JP | A-9-331063 | 12/1997 |
| JP | B2-2794565 | 6/1998 |
| JP | A-10-229119 | 8/1998 |
| JP | 10-233387 | 9/1998 |
| JP | A-11-97523 | 4/1999 |
| JP | A-11-102961 | 4/1999 |
| JP | 11-135489 | 5/1999 |

OTHER PUBLICATIONS

U. S. patent application Ser. No. 08/992,108, Soga, filed Dec. 17, 1997.

U.S. patent application Ser. No. 09/143,513, Ishikawa, filed Aug. 28, 1998.

* cited by examiner

| | PRIOR WORK | EMBODIMENT |
|---|---|---|
| ANISOTROPIC ETCHING | | |
| FORWARD TAPER ETCHING | | |
| ISOTROPIC ETCHING | | |

INTEGRATED GATE BIPOLAR TRANSISTOR AND METHOD OF MANUFACTURING THE SAME

CROSS REFERENCE TO RELATED APPLICATION

This application is based upon Japanese Patent Application No. Hei. 11-221242 filed on Aug. 4, 1999, the contents of which are incorporated herein by reference.

BACKGROUND OF THE INVENTION

1. Field of the Invention

This invention relates to method of manufacturing a semiconductor device, and particular to a method of manufacturing a semiconductor device having a trench formed in a semiconductor substrate. This invention also related to insulated gate bipolar transistors (IGBT), and to a method of manufacturing an insulated gate bipolar transistor.

2. Related Art

In a hybrid car or an electric vehicle (EV), an inverter module is used as a converter that converts a large direct current from a battery into an alternating current for an actuating system such as a motor. For example, IGBT elements are used as the inverter module.

Here, recently, a trench gate type IGBT element, having a trench gate structure as a device structure, has been proposed to downsize the IGBT element or lower a resistance of the IGBT. According to this kind of trench gate type IGBT element, a trench (deep groove) is formed in a silicon substrate by using a dry etching (anisotropic etching); and a gate is formed on the trench.

In a case of the trench gate type IGBT element in the above, a corner of a bottom portion of the trench is angular. Therefore, a film quality of a gate oxide film may deteriorate or may be thinned at this corner, or an electric field may concentrate at this corner. As a result, a withstand voltage breakdown may easily occur at this corner.

Incidentally, the inconvenient in the above may be cancelled by rounding off the corner at the bottom of the trench. Conventionally, the corner at the bottom of the trench has rounded off by using a method as described in JP A 64-57623 or JP A 9-330928. According to the method in these Japanese patent applications, after forming the trench using an anisotropic etching, the corner is rounded off by conducting an isotropic etching to the bottom of the trench.

However, such the isotropic etching is conducted to sufficiently round off the corner, since silicon is excessively etched, a structure of the trench or a structure of a device may be changed from a designed structure. Therefore, it needs to reduce an amount of etching using the isotropic etching as much as possible. As a result, the corner at the bottom of the trench is not sufficiently rounded off, so that a radius of curvature of the corner may become small.

SUMMARY OF THE INVENTION

This invention has been conceived in view of the background thus far described and its first object is to sufficiently round off a corner at a bottom of a trench with restricting silicon from being excessively etched.

According to the present invention, a trench having a bottom is formed at a surface of a semiconductor substrate by conducting an anisotropic etching. After forming the trench, a bottom of the trench including a corner portion is processed into a concave shape by conducting a concave etching. Here, the concave etching etches the semiconductor substrate so that a diameter of the trench is gradually reduced as the etching advances. After processing the corner portion, the corner portion of the bottom of the trench is rounded off by conducting an isotropic etching. Since the corner portion is chamfered by using the concave etching, a radius of curvature of the corner portion at the bottom of the trench can be increased even if an amount of the etching using the isotropic etching conducted later is small.

In other words, according to the present invention, the radius of curvature r1 of the bottom of the trench can be freely and easily controlled, by controlling a depth and a sidewall angle by the concave etching and by controlling the amount of etching using the isotropic etching. Therefore, even if the amount of the etching using the isotropic etching e1 is set small, the corner portion of the bottom of the trench can be efficiently rounded off, and excessive etching of the silicon can be prevented.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

Hereinafter, a preferred embodiment in which the present invention is applied to an N-channel type trench gate type IGBT element will be explained with reference to drawings.

Figure 2:
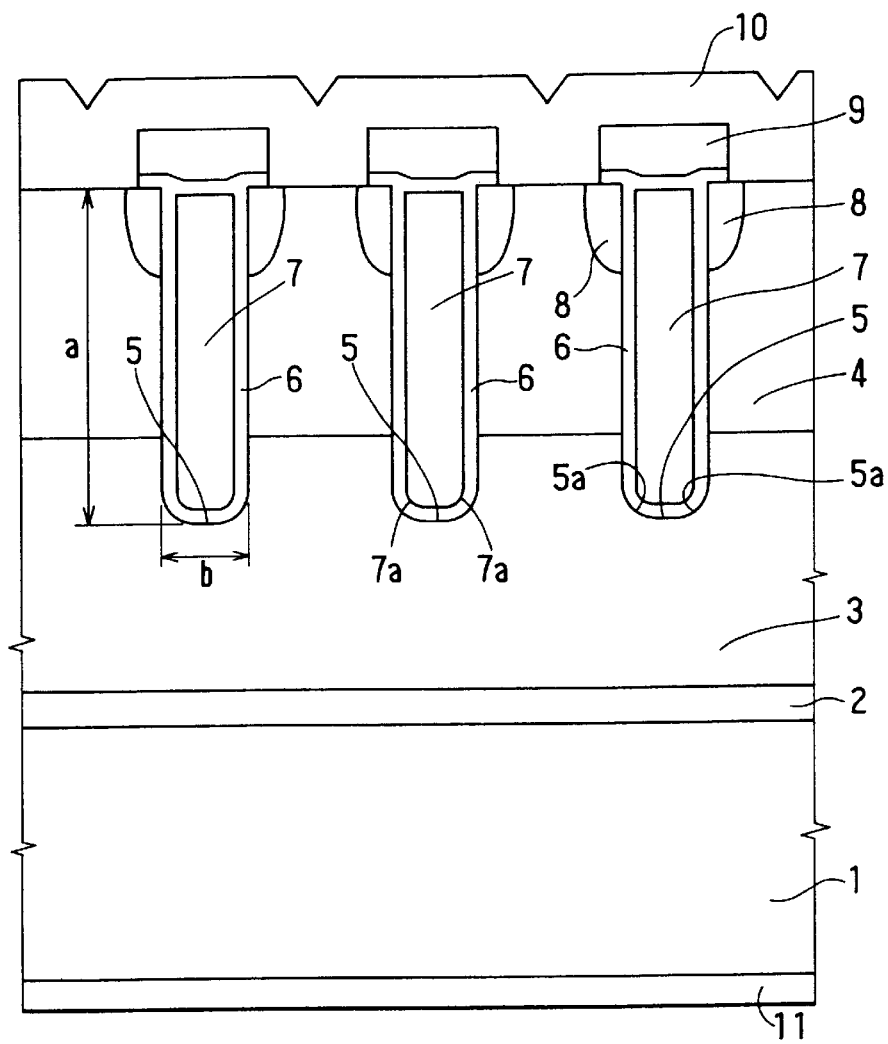
FIG. 2 is a sectional view of a trench gate type IGBT element.

FIG. 2 schematically shows a vertical sectional view of the trench gate type IGBT element. As shown in FIG. 2, an $N^+$-type silicon epitaxial layer 2, an N-type silicon epitaxial layer 3, and a P-type base diffusion layer 4 are formed in a $P^+$-type monocrystalline silicon substrate 1 as a collector.

A trench 5 is formed at a surface of the $P^+$-type monocrystalline silicon substrate 1 by using a method described later. The trench 5 is formed so that a lower end of the trench is extended into the N-type silicon epitaxial layer 3. A corner portion 5a at a bottom portion of the trench 5 is rounded off. In this case, a length a of the trench in vertical direction in FIG. 2 is set to, for example, 4–6 μm, and a length b of the trench in transverse direction in FIG. 2 is set to, for example, 0.8–1.6 μm.

A gate electrode 7 is formed in the trench 5 via a gate oxide film 6. The gate oxide film 6 is made up, for example, silicon oxide film, has a thickness of, for example, 100 nm. Here, it is preferable to set a thickness of the gate oxide film 6 to an adequate value within a range of, for example, 50–150 nm. Furthermore, the gate oxide film 6 may be formed by ONO film (a three-layered film including a silicon oxide film, a nitride film, and a silicon oxide film). In a case where the ONO film is used, it is preferable to set a thickness of the ONO film to thinner, for example, 60 nm.

The gate electrode 7 is made of, for example, N-type polycrystalline silicon. A corner portion 7a of a lower end portion of the gate electrode 7 is rounded off. Furthermore, N-type emitter diffusion layer 8 is formed in the P-type base diffusion layer 4 where corresponding to an upper end portion of the trench 5. An emitter electrode 10 is formed on the gate electrode 7 via an interlayer insulator 9. A collector electrode 11 as a back surface electrode is formed on a back surface (a lower surface in FIG. 2) of the P$^+$-type monocrystalline silicon substrate 1 of the IGBT element.

Figure 3:
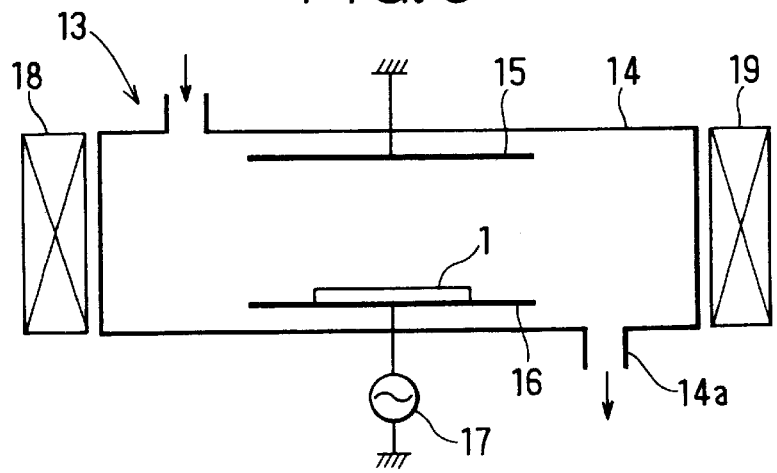
FIG. 3 is a schematic diagram illustrating an RIE apparatus.

Next, a method of manufacturing the trench gate type IGBT element described in the above will be explained with reference to FIGS. 1 through 3. Hereinafter, a process regarding forming the trench will be mainly explained. Here, other processes than the process regarding forming the trench may be the substantially the same as those of conventional method.

Figure 1A:
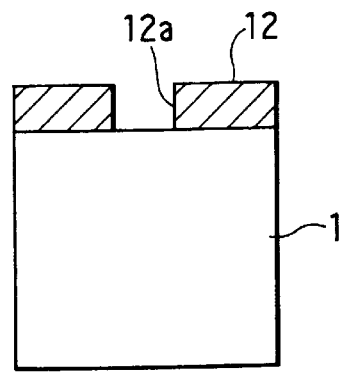
FIGS. 1A through 1D are sectional views of a semiconductor device for illustrating a method of manufacturing of a preferred embodiment.
Figure 1B:
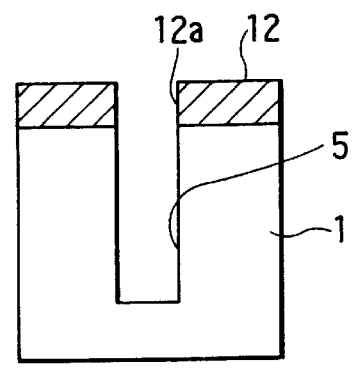

In this case, as shown in FIG. 1A, a trench mask 12 is formed on a surface of the silicon substrate 1. The trench mask 12 has an opening portion 12a for forming the trench. Here, the silicon layers 2, 3, and 4 described in the above are formed on the silicon substrate 1 in advance by using a conventional method.

Next, the trench 5 is formed in the silicon substrate 1 by conducting the anisotropic etching (first step, or trench etching). The anisotropic etching is a dry etching, and is conducted in the RIE (Reactive Ion Etching) apparatus 13 as shown in FIG. 3.

The RIE apparatus 13 is provided with an etching chamber 14, an upper electrode 15 provided in the etching chamber 14, a lower electrode 16 provided in the etching chamber 14 and facing to the upper electrode 15, a radiofrequency power source 17 for applying a radio-frequency (RF) power between the electrodes 15 and 16, and a pair of magnet coils 18 and 19 provided at both end portions of outer portion of the etching chamber 14. In this case, the silicon substrate 1 (wafer) is mounted on the lower electrode 16; a predetermined gas is sealed in the etching chamber 14; and the radio-frequency power is applied between the electrodes 15 and 16 with applying a predetermined magnetic field to the etching chamber 14. The anisotropic etching (i.e., the RIE) is conducted under this condition.

Here, parameters of the anisotropic etching executed in the first step (STEP 1) are shown in the following table 1.

The table 1 shows two examples each of which is actually manufactured by using the anisotropic etching. The trench 5 having an adequate shape has formed by the examples 1 and 2. Here, perpendicularity of a sidewall of the trench formed in the example 2 is better than that in the example 1.

Figure 1C:
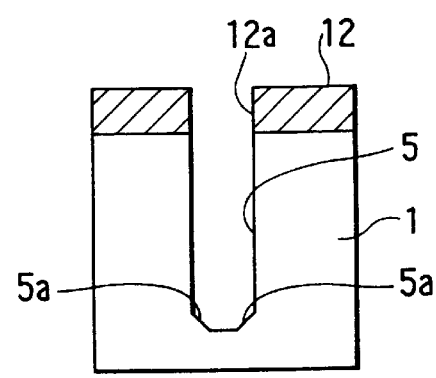

After performing the STEP 1, as shown in FIG. 1C, the bottom of the trench 5 including the corner 5a has been formed to a concave shape (funnel shape surface, or chamfered slant surface) by conducting a concave etching. The step is a second step (STEP 2). The concave etching includes, for example, a dry etching conducted in the RIE apparatus 13 described in the above. Here, parameters of the concave etching executed in the second step (STEP 2) are shown in the following table 2.

The table 2 shows two examples each of which is actually manufactured by using the concave etching. The concave shape (funnel shape surface, or chamfered slant surface) having an adequate shape has been formed by the examples 3 and 4. In this case, the concave etching of the example 3 is a dry etching in which an etching is advanced with depositing a protection film (silicon oxide film) on the sidewall of the trench 5 by increasing an oxygen concentration in the etching chamber 14. The concave etching is a dry etching in which pressure in the etching chamber 14 is increased and which a vertical component of incident direction of ion is decreased by lowering the radio frequency power applied between the electrodes 15 and 16. More detail, the anisotropic etching vertically etches the substrate so that a diameter of the trench is substantially the same along a depth direction of the substrate. On the contrary, the concave etching vertically etches the substrate so that a diameter of the trench is gradually reduced as the etching advances. As a result, the corner portion 5a at the bottom of the trench becomes a concave surface having a slant surface, as shown in FIG. 1C.

In this embodiment, when the process is moved from the STEP 1 to STEP 2, the radio frequency power is turned off; gas in the etching chamber 14 is discharged through a discharge port 14a; gas for the STEP 2 is introduced to the etching chamber 14 through a supply port 14b to exchange the gas; and then the etching is performed. Here, each of the STEPS 1 and 2 may be conducted in different RIE apparatuses.

In this embodiment, when the STEP 1 applies the example 1, the STEP 2 may apply either example 3 or example 4. Similarly, when the STEP 1 applies the example 1, the STEP 2 may apply either example 3 or example 4. In either combination, the concave shape surface having the adequate shape can be formed at the corner portion 5a of the trench 5.

Here, in this embodiment, the dry etching as shown in examples 3 and 4 is used as the concave etching. However, this dry etching may be replaced with the following etching. That is, after performing the anisotropic etching (dry etching) of the STEP 1, only the radio frequency power is decreased without changing the component and pressure of the gas in the etching chamber 14, and the etching is performed under this condition. This modification can also form the concave shape surface at the corner portion 5a of the bottom of the trench 5. Furthermore, a wet etching in which an etching is performed with controlling a surface orientation of the wafer may be used instead of the dry etching.

Figure 1D:
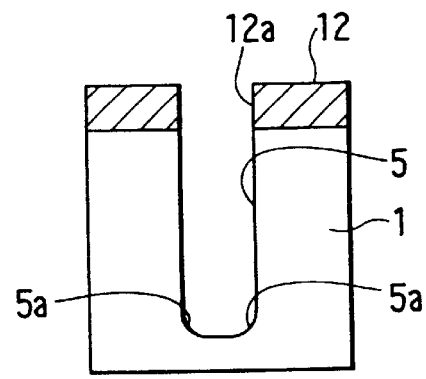

Next, after performing the STEP 2, as shown in FIG. 1D, the corner portion 5a of the bottom of the trench 5 is rounded off by performing the isotropic etching. This third step is a STEP 3. As the isotropic etching, it is preferable to use a conventional downstream type isotropic etching apparatus and use CF$_4$ and O$_2$ as etching gas, when the etching is performed. Furthermore, a CDE (Chemical Dry Etching) apparatus may be used instead of the downstream type isotropic etching apparatus, or other isotropic etching apparatus may be used.

According to this embodiment using the above method, a radius of curvature of the corner portion 5a of the bottom of the trench 5 can be increased even if an amount of the etching using the isotropic etching in the STEP 3 is small. Hereinafter, effects of this embodiment will be explained with reference to FIG. 4, with comparing this embodiment with the prior work.

Figure 4:
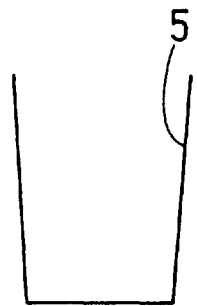
FIG. 4 is sectional views of the trench illustrating the method of manufacturing of the preferred embodiment and a prior work.

As shown in FIG. 4, according to this embodiment, the anisotropic etching, the concave etching, and the isotropic etching are performed. On the contrary, according to the prior work, only the anisotropic etching and the isotropic etching are performed. With this difference, as shown in FIG. 4, when the amount of the etching using the isotropic etching in the last process is set to equal each other (=e1) between the this embodiment and the prior work, the radius of curvature r1 at the corner portion 5a of the bottom of the trench 5a can be set larger than that of the prior work (=r2). The reason is as follows. In the case of this embodiment, after forming the trench 5 by performing the anisotropic etching, the bottom of the trench 5 including the corner portion 5a is formed to the concave shape (chamfered slant surface) by performing the concave etching.

In other words, according to this embodiment, the radius of curvature r1 of the of the bottom of the trench 5 can be freely and easily controlled, by controlling a depth and a sidewall angle by the concave etching and by controlling the amount of etching using the isotropic etching. Therefore, even if the amount of the etching using the isotropic etching e1 is set small, the corner portion 5a of the bottom of the trench 5 can be efficiently rounded off, and excessive etching of the silicon can be prevented.

Figure 5:
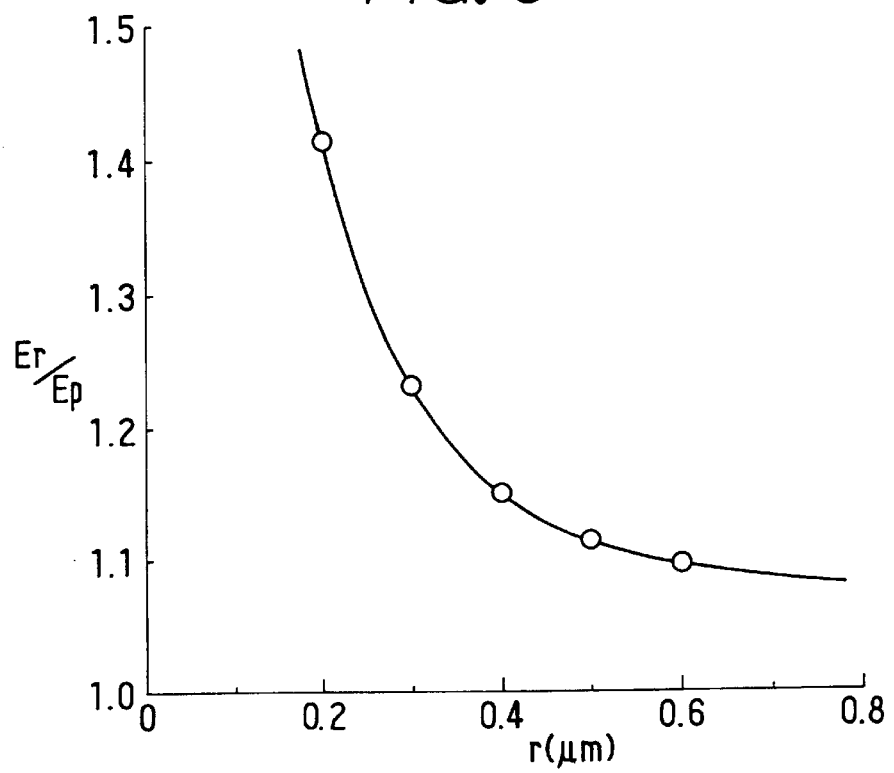
FIG. 5 is a graph illustrating a relationship between a radius of curvature r at the corner of the bottom of the trench and a ratio of electric field intensities Er/Ep.

FIG. 5 shows a graph illustrating a relationship between a radius of curvature r at the corner portion 5a of the bottom of the trench 5 and a ratio of electric field intensities Er/Ep that indicates a factor of electric field concentration. Here, Er indicates electric field intensity at the corner portion of the bottom of the trench 5, and Ep indicates electric field intensity at a flat portion of the sidewall of the trench 5. In this graph, the electric field intensity becomes small as the ratio of electric field intensities Er/Ep approaches 1. In otherwords, the Er/Ep becomes small. According to FIG. 5, the electric field intensity becomes large as the radius of curvature r at the corner portion 5a becomes small. When the radius of curvature r1 is within a range of approximately 0.3 $\mu$m-approximately 0.5 $\mu$m, the electric field is reduced to less than a predetermined level within which the electric field intensity does not substantially occur. Here, FIG. 5 shows an example in which a thickness Tox of the gate oxide film 6 is 0.1 $\mu$m (100 nm).

Figure 6:
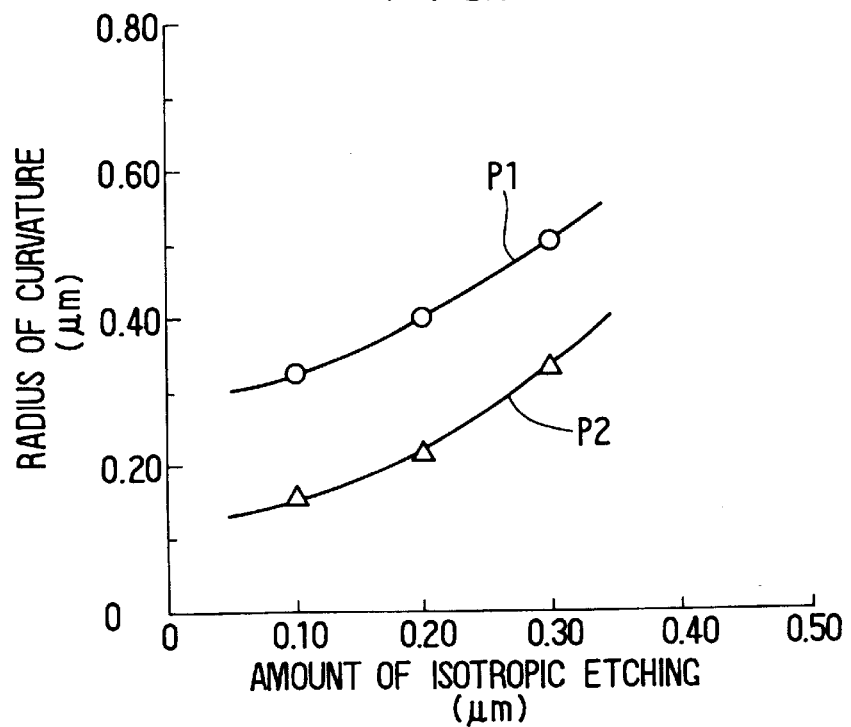
FIG. 6 is a graph illustrating a relationship between a radius of curvature r at the corner of the bottom of the trench and an amount of etching using an isotropic etching.

FIG. 6 is a graph illustrating a relationship between a radius of curvature r at the corner portion 5a of the bottom of the trench 5 and an amount of etching using an isotropic etching. In FIG. 6, a line P1 shows this embodiment, and a line P2 shows a prior work. According to FIG. 6, when the amount of the etching using the isotropic etching is set to equal each other between the this embodiment and the prior work, the radius of curvature r at the corner portion 5a of the bottom of the trench 5a can become larger than that of the prior work r.

It is preferable to set the amount of the etching using the isotropic etching within a range of 0.10–0.20 $\mu$m. Within this range, the radius of curvature r of the corner portion 5a of the bottom of the trench 5 becomes approximately 0.30— approximately 0.40 $\mu$m, that is an efficiently large radius of curvature. When the corner portion 5a having the radius of curvature like this embodiment can mostly prevent an occurrence of the electric field concentration. On the contrary, when the amount of etching using the isotropic etching is more than 0.20 $\mu$m, the silicon may be excessively etched (removed), and therefore a characteristic of the IGBT element may deteriorate.

Here, in the above embodiment, the present invention is applied to the N-channel type trench gate type IGBT element. However, the present invention may be applied to a P-channel type trench gate type IGBT element. Furthermore, the present invention may be applied to other semiconductor element (for example, MOSFET etc) having the trench gate structure. Moreover, the present invention may be applied to a semiconductor element which has a trench for isolation and insulation (STI (Shallow Trench Isolation)).

What is claimed is:

1. A method of manufacturing a semiconductor device comprising:
    forming a trench at a surface of a semiconductor substrate by conducting an anisotropic etching, the trench having a bottom;
    processing a bottom of the trench including a corner portion into a concave shape having a slant surface by conducting a concave etching after forming the trench, wherein the concave etching etches the semiconductor substrate so that a diameter of the trench is gradually reduced as the concave etching advances; and
    rounding off the corner portion of the bottom of the trench by conducting an isotropic etching, after processing the corner portion, wherein a ratio of a horizontal etching rate with respect to a vertical etching rate of the concave etching is smaller than a ratio of the horizontal etching rate with respect to the vertical etching rate of the isotropic etching.

2. The method of claim 1, wherein the concave etching includes a dry etching that etches the trench with depositing a protective film on a sidewall of the trench.

3. The method of claim 1, wherein the concave etching includes a dry etching that etches the trench with decreasing vertical components of ions in an incident direction.

4. The method of claim 1, wherein the concave etching includes a dry etching that etches the trench with decreasing a power of the etching.

5. The method of claim 1, wherein the concave etching includes a dry etching that etches the trench with keeping an internal pressure of an etching chamber to a high pressure than a pressure during forming the trench.

6. The method of claim 1, wherein the concave etching includes a wet etching that etches the trench with controlling a surface orientation of a wafer in which the trench is formed.

7. A method of manufacturing a semiconductor device comprising:
    forming a trench at a surface of a semiconductor substrate by conducting an anisotropic etching, the trench having a bottom;
    processing a bottom of the trench including a corner portion into a concave shape having a slant surface by conducting a concave etching after forming the trench, wherein the concave etching etches the semiconductor substrate so that a diameter of the trench is gradually reduced as the concave etching advances; and
    rounding off the corner portion of the bottom of the trench by conducting an isotropic etching, after processing the corner portion, wherein
        the anisotropic etching is conducted by using gas containing HBr, $SF_6$, He, and $O_2$; and
        the concave etching is conducted by using gas containing HBr, $SF_6$, He, and $O_2$, and a concentration of the $SF_6$ gas is smaller than that of the $SF_6$ gas in the anisotropic etching.

8. A method of manufacturing a semiconductor device comprising:
    forming a trench at a surface of a semiconductor substrate by conducting an anisotropic etching, the trench having a bottom;

processing a bottom of the trench including a corner portion into a concave shape having a slant surface by conducting a concave etching after forming the trench, wherein the concave etching etches the semiconductor substrate so that a diameter of the trench is gradually reduced as the concave etching advances; and rounding off the corner portion of the bottom of the trench by conducting an isotropic etching, after processing the corner portion, wherein the anisotropic etching and the concave etching are conducted in a common etching chamber;

a pressure in the etching chamber during the concave etching is higher than that during the anisotropic etching;

a radio frequency power for ionizing the etching gas during the concave etching is lower than that during the anisotropic etching; and the concave etching is conducted by using gas containing HBr, $SF_6$, He, and $O_2$, and a concentration of the $SF_6$ gas is smaller than that in the anisotropic etching.

9. The method of claim 1, wherein the isotropic etching is conducted by using etching gas including $CF_4$ and $O_2$.

10. The method of claim 1, wherein the isotropic etching is a chemical dry etching using etching gas including $CF_4$ and $O_2$.

11. The method of claim 1, wherein the anisotropic etching, the concave etching, and the isotropic etching are dry etchings.

12. A method for manufacturing an insulated gate bipolar transistor in which a gate electrode is formed in a trench formed at a surface of the semiconductor substrate, the method comprising:

forming a trench at a surface of a semiconductor substrate by conducting an anisotropic etching, the trench having a bottom;

processing a bottom of the trench including a corner portion into a concave shape having a slant surface by conducting a concave etching after forming the trench, wherein the concave etching etches the semiconductor substrate so that a diameter of the trench is gradually reduced as the concave etching advances; and rounding off the corner portion of the bottom of the trench by conducting an isotropic etching, after processing the corner portion, wherein a ratio of a horizontal etching rate with respect to a vertical etching rate of the concave etching is smaller than a ratio of the horizontal etching rate with respect to the vertical etching rate of the isotropic etching.

* * * * *